US 8,373,155 B2

(12) United States Patent
Okamura et al.

(10) Patent No.: US 8,373,155 B2
(45) Date of Patent: Feb. 12, 2013

(54) INFRARED PHOTODETECTOR

(75) Inventors: Toshihiro Okamura, Shibuya (JP);
Mitsuhiro Nagashima, Suginami (JP);
Michiya Kibe, Sagamihara (JP);
Hironori Nishino, Kawasaki (JP);
Yasuhito Uchiyama, Kawasaki (JP);
Yusuke Matsukura, Kawasaki (JP)

(73) Assignees: Technical Research & Development Institute Ministry of Defense of Japan, Tokyo (JP); Fujitsu Limited, Kawasaki (JP)

( * ) Notice: Subject to any disclaimer, the term of this patent is extended or adjusted under 35 U.S.C. 154(b) by 316 days.

(21) Appl. No.: 12/534,421

(22) Filed: Aug. 3, 2009

(65) Prior Publication Data

US 2010/0032652 A1    Feb. 11, 2010

(30) Foreign Application Priority Data

Aug. 8, 2008    (JP) ................................ 2008-205241

(51) Int. Cl.
*H01L 31/09*    (2006.01)
(52) U.S. Cl. .................... 257/21; 257/E31.093; 977/774
(58) Field of Classification Search .................... 257/21, 257/22, E31.054, E31.093, E31.021; 977/774, 977/954
See application file for complete search history.

(56) References Cited

U.S. PATENT DOCUMENTS

| 5,047,810 | A * | 9/1991 | Chemla et al. .................... 257/25 |
| 7,745,816 | B2 * | 6/2010 | Mohseni ........................... 257/21 |
| 2004/0046176 | A1 | 3/2004 | Kim et al. |
| 2005/0017176 | A1 * | 1/2005 | Koch et al. .................. 250/338.4 |
| 2005/0082520 | A1 * | 4/2005 | Fathimulla et al. ............. 257/14 |
| 2007/0086498 | A1 * | 4/2007 | Ono et al. .................. 372/43.01 |
| 2007/0137693 | A1 * | 6/2007 | Forrest ........................... 136/255 |
| 2007/0262292 | A1 * | 11/2007 | Matsukura ........................ 257/9 |

FOREIGN PATENT DOCUMENTS

| JP | 10-256588 A | 9/1998 |
| JP | 10-326906 A | 12/1998 |
| JP | 2004-104085 A | 4/2004 |
| JP | 2004-349542 A | 12/2004 |
| JP | 2006-12974 A | 1/2006 |

OTHER PUBLICATIONS

A. D. Stiff-Roberts et al., "Tailoring of Quantum Dot Infrared Photoconductor Performance with AlAs/GaAs Superlattice Barriers", Lasers and Electro-Optics Society, 2003; The 16th Annual Meeting of the IEEE, vol. 2, pp. 925-926.
Japanese Office Action dated Oct. 6, 2009, issued in Japanese Patent Application No. 2008-205241.
S. Chakrabarti et al.; "High responsivity AlAs/InAs/GaAs superlattice quantum dot infrared photodetector"; Electron. Lett., Feb. 5, 2004, pp. 197-198, vol. 40, No. 3.

* cited by examiner

*Primary Examiner* — Wensing Kuo
(74) *Attorney, Agent, or Firm* — Westerman, Hattori, Daniels & Adrian, LLP

(57) ABSTRACT

An infrared photodetector including a layer structure of an intermediate layer, and a quantum dot layer having a narrower band gap than the intermediate layer and including a plurality of quantum dots alternately stacked, and detecting photocurrent generated when infrared radiation is applied to the layer structure to thereby detect the infrared radiation, the infrared photodetector further including a first barrier layer provided on one side of the quantum dot layer and having a larger band gap than the intermediate layer; and a second barrier layer provided on the other side of the quantum dot layer and having a larger band gap than the intermediate layer.

10 Claims, 11 Drawing Sheets

US 8,373,155 B2

INFRARED PHOTODETECTOR

CROSS-REFERENCE TO RELATED APPLICATION

This application is based upon and claims the benefit of priority of the prior Japanese Patent Application No. 2008-205241, filed on Aug. 8, 2008, the entire contents of which are incorporated herein by reference.

FIELD

The embodiment discussed herein is related to an infrared photodetector.

BACKGROUND

As a conventional quantum dot infrared photodetector is known an infrared photodetector which comprises a layer structure of an intermediate layer and a quantum dot layer including a plurality of quantum dots whose band gap is narrower than that of the intermediate layer alternately stacked and detects photocurrent generated by the excitation of electrons or holes in the quantum dots when infrared radiation is applied to the layer structure to thereby detect infrared radiation.

In this infrared photodetector, the intermediate layer of GaAs or others with quantum dots of InAs or others buried in is a photoabsorbing unit layer, and this photoabsorbing unit layer is stacked plural times to thereby from the layer structure (see Japanese Laid-open Patent Publication No. 10-256588).

SUMMARY

According to aspects of an embodiment, an infrared photodetector including a layer structure of an intermediate layer, and a quantum dot layer having a narrower band gap than the intermediate layer and including a plurality of quantum dots alternately stacked, and detecting photocurrent generated when infrared radiation is applied to the layer structure to thereby detect the infrared radiation, the infrared photodetector further including a first barrier layer provided on one side of the quantum dot layer and having a larger band gap than the intermediate layer; and a second barrier layer provided on the other side of the quantum dot layer and having a larger band gap than the intermediate layer.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENT

Figure 7:
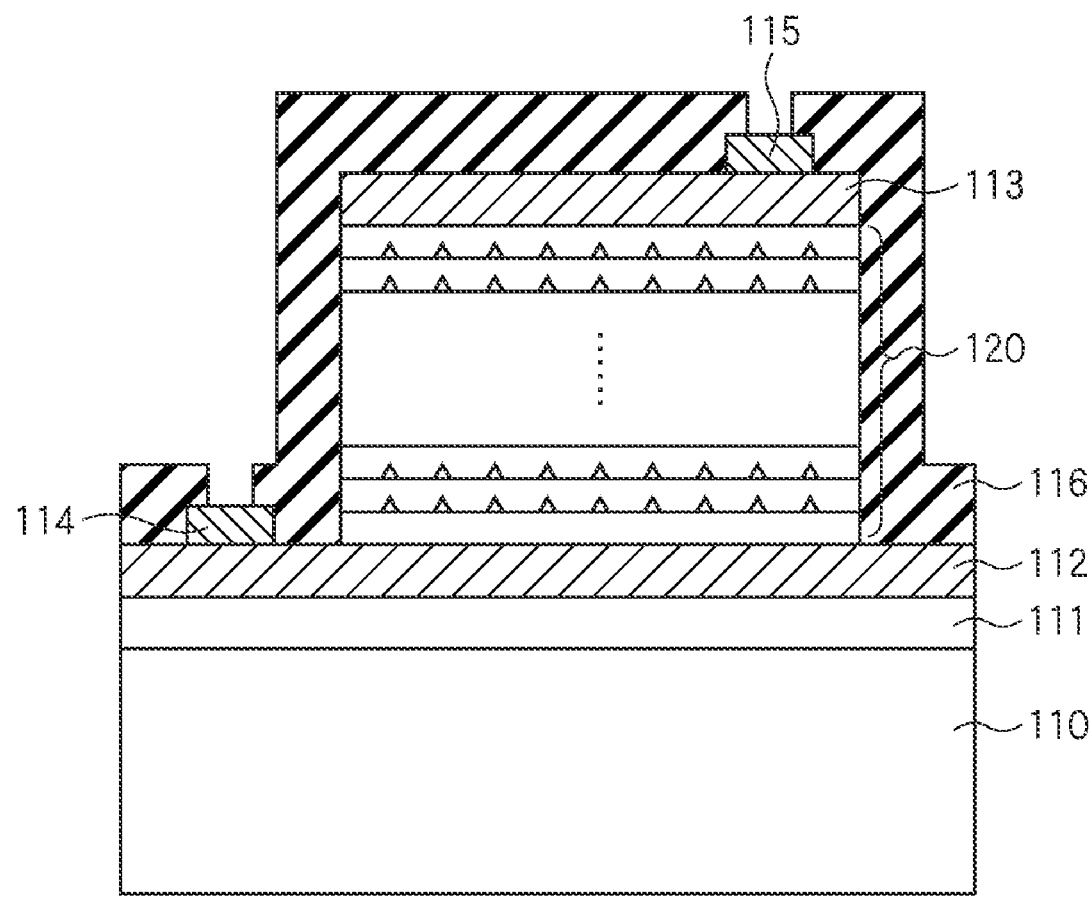
FIG. 7 is a sectional view of the proposed infrared photodetector, which illustrates the structure.
Figure 8:
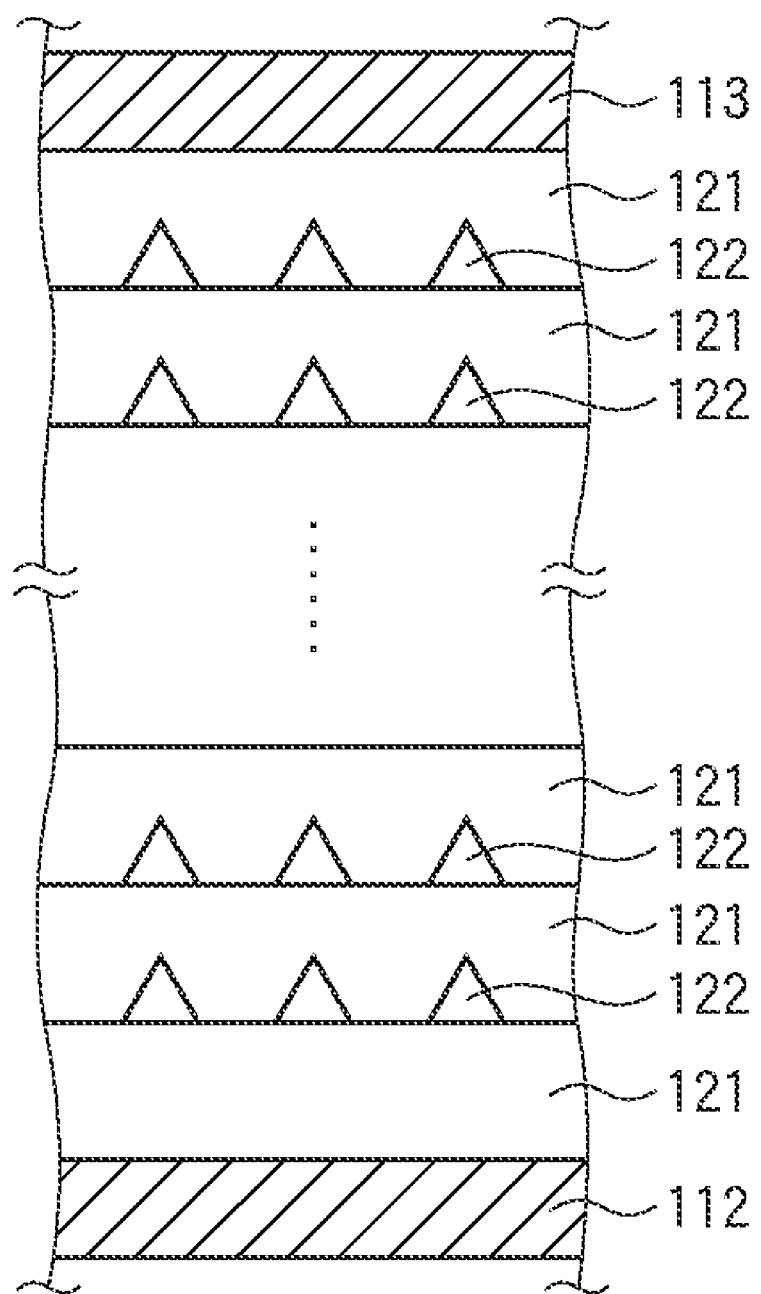
FIG. 8 is a sectional view of the proposed infrared photodetector, which details the photodetection structure.
Figure 9:
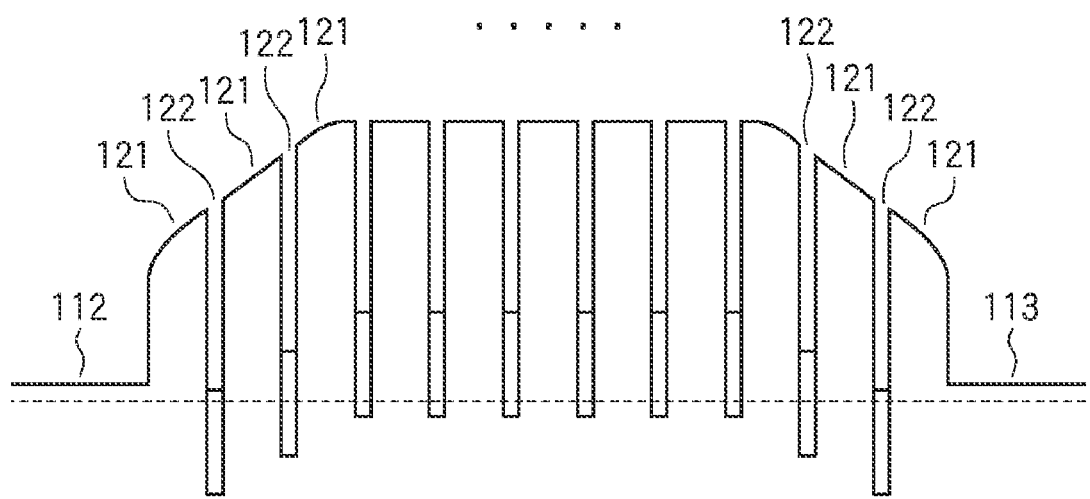
FIG. 9 is the energy band view of the proposed infrared photodetector.

Before an embodiment is explained, for the comparison with the embodiment, a proposed infrared photodetector will be explained with reference to FIGS. 7 to 9. FIG. 7 is a sectional view of the proposed infrared photodetector, which illustrates the structure. FIG. 8 is a sectional view of the proposed infrared photodetector, which details the photodetection structure. FIG. 9 is the energy band view of the proposed infrared photodetector.

As illustrated in FIG. 7, on a GaAs substrate 110, a lower contact layer 112 of an n-GaAs layer is formed with a buffer layer 111 of a GaAs layer. On the lower contact layer 112, a photodetection structure 120 of a plurality of semiconductor layers stacked. The photodetection structure 120 will be detailed later.

On the photodetection structure 120, an upper contact layer 113 of an n-GaAs layer is formed. The photodetection structure 120 and the upper contact layer 113 are processed in a mesa. On the lower contact layer 112, a lower electrode layer 114 of an AuGe/Au layer is formed, and the upper electrode layer 115 of an AuGe/Au layer is formed on the upper contact layer 113. A protection layer 116 of an SiON layer is formed except on the upper surface of the lower electrode layer 114 and the upper surface of the upper electrode layer 115.

Next, the photodetection structure 120 will be detailed with reference to FIG. 8.

In the photodetection structure 120, an intermediate layers 121 of an i-AlGaAs layer is formed on the lower contact layer 112. On the intermediate layer 121, a quantum dot layer 122 including a plurality of quantum dots of InAlAs is formed.

On the quantum dot layer 122, an intermediate layer 121 of the i-AlGaAs layer is formed, covering the plural quantum dots, and furthermore, a quantum dot layer 122 is formed on the intermediate layer 121. The intermediate layer 121 and the quantum dot layer 122 are stacked repeatedly in this order. On the uppermost intermediate layer 121 of the thus stacked photodetection structure 120, the upper contact layer 113 is formed.

Next, the energy band structure of the proposed infrared photodetector will be explained with reference to FIG. 9.

Generally in the infrared photodetectors, it contributes to the improvement of the performance to decrease unnecessary current component (dark current) other than signals generated by the photoresponse, i.e., photocurrent. The wavelength range where the infrared photodetectors are sensitive to make the photoresponse is also an important charactersitic. In applications, such as infrared photography, etc., infrared photodetectors which are sensitive to relatively long wavelengths, e.g., sensitive wavelength 8-12 μm are suitable.

To reduce the unnecessary current component (dark current) other than photocurrent, in the proposed infrared photodetector, as illustrated in the energy band view of FIG. 9, an i-AlGaAs layer, whose barrier energy to dark current is large, is used as the intermediate layer 121.

In the case that InAs quantum dots are used as the quantum dot layer 122 for the intermediate layer 121 of the i-AlGaAs layer, the band gap of the intermediate layer 121 is large for the band gap of the InAs quantum dots, and the energy necessary for the photoresponse is large. Response characteristics of required long wavelength cannot be obtained.

Thus, as in the proposed infrared photodetector, the quantum dots of InAlAs mixed crystal, whose band gap is larger than InAs are used as the quantum dot layer 122, whereby the energy necessary for the photoresponse is made small, and the wavelength to be responded made longer.

However, the use of the quantum dots of InAlAs mixed crystal as the quantum dot layers 122 as in the proposed infrared photodetector makes shallow the wells of the energy of the quantum dot layers 122 including the quantum dots of InAlAs mixed crystal, and the quantum confining effect of the concave potential of the wells of energy becomes weak, and the sensitivity of the photoresponse is resultantly reduced.

As described above, the proposed infrared photodetector has a problem that the use of a wide-band gap material as the quantum dots for the purpose of making long the wavelength to be responded weakens the quantum confining effect of the quantum dot layer, and resultantly, the sensitivity of the photoresponse is reduced.

As described above, in the quantum dot infrared photodetector, the use of a material of a large band gap as the intermediate layer for the purpose of dark current reduction makes the energy for the quantum dots to require for the photoresponse also becomes large, and required long wavelength characteristics cannot be obtained. Then, when a material of a large band gap is used as the quantum dots to obtain required long wavelength characteristics has problems that the quantum confining effect is decreased, and the photosensitivity is decreased.

Preferred embodiment will be explained with reference to accompanying drawings.

[A] One Embodiment

Figure 1:
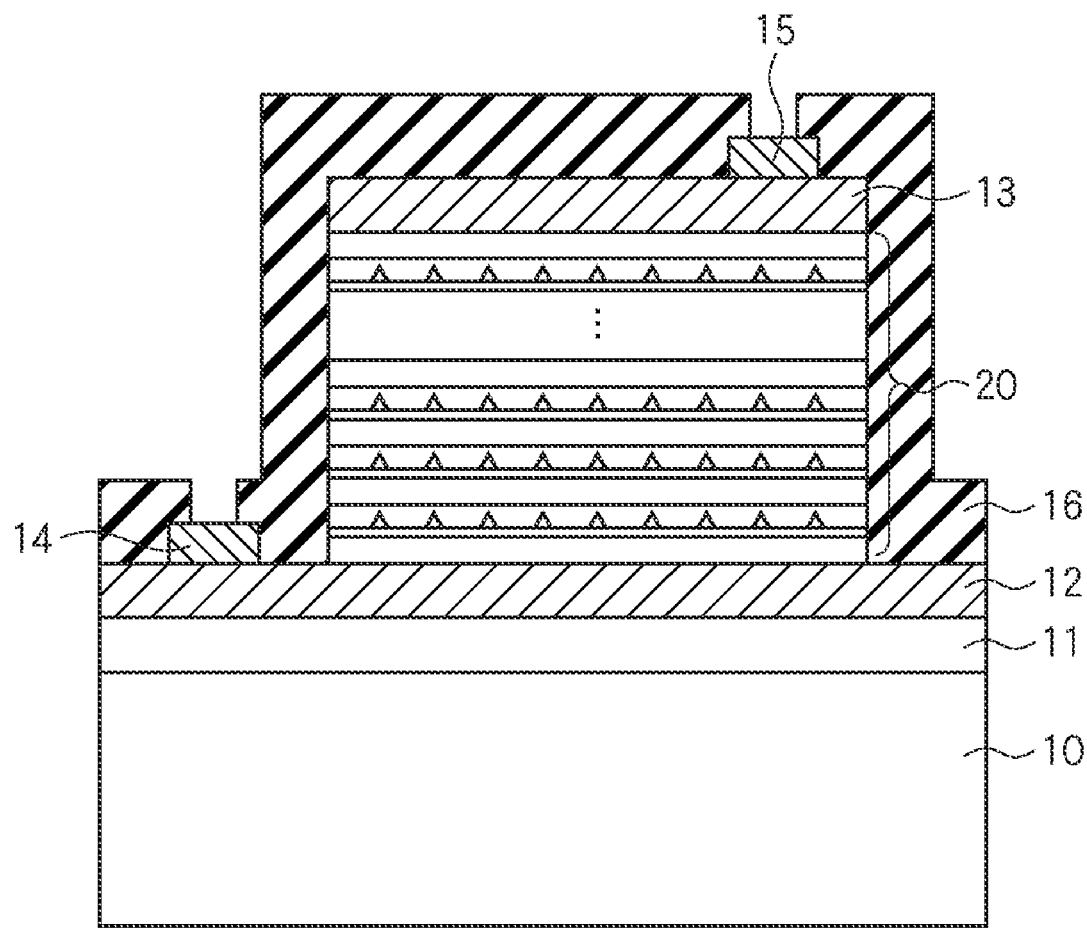
FIG. 1 is a sectional view of the infrared photodetector according to one embodiment, which illustrates the structure.
Figure 2:
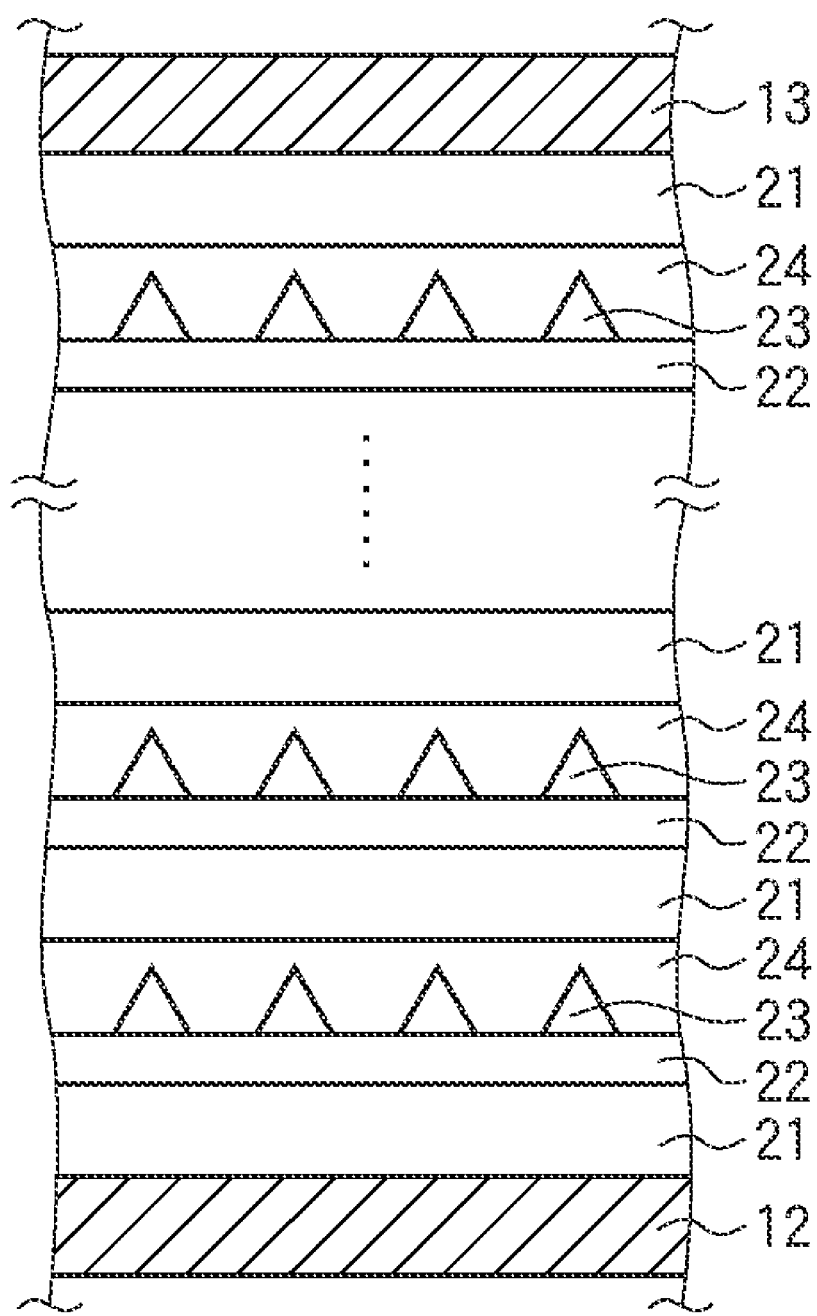
FIG. 2 is a sectional view of the infrared photodetector according to the embodiment, which details the photodetection structure.
Figure 3:
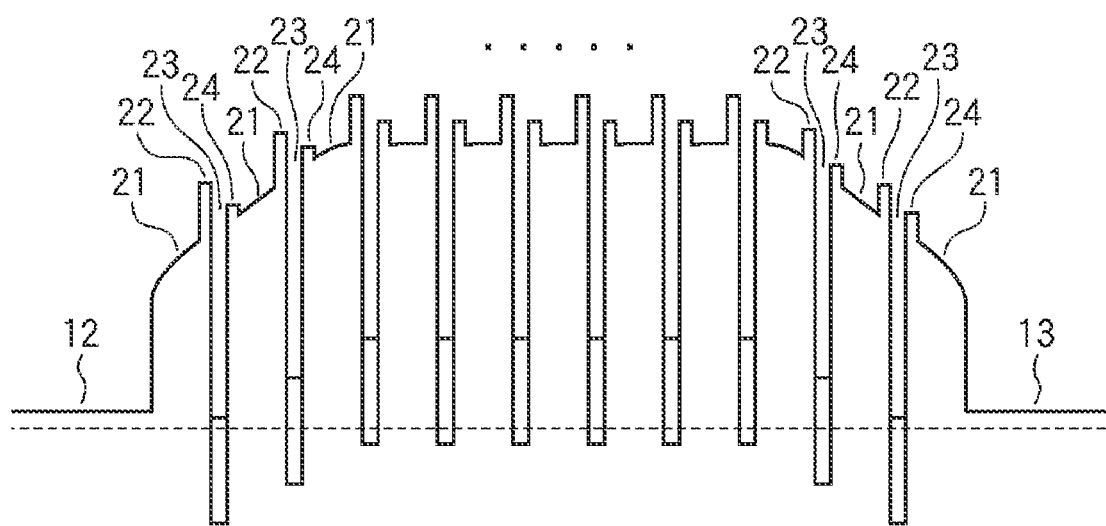
FIG. 3 is the energy band view of the infrared photodetector according to the embodiment.

The infrared photodetector according to one embodiment will be explained with reference to FIGS. 1 to 3. FIG. 1 is a sectional view of the infrared photodetector according to the present embodiment, which illustrate the structure. FIG. 2 is a sectional view of the infrared photodetector according to the present embodiment, which details the photodetection structure. FIG. 3 is the energy band view of the infrared photodetector according to the present embodiment.

As illustrated in FIG. 1, in the infrared photodetector according to the present embodiment, on a GaAs substrate 10 whose upper surface is (001), the lower contact layer 12 of an about 500 nm-thickness n-GaAs layer of a $1\times10^{18}$ cm$^{-3}$ carrier concentration is formed with the buffer layer 11 of an about 100 nm-thickness GaAs layer.

On the lower contact layer 12, the photodetection structure 20 of a plurality of semiconductor layers stacked is formed. When infrared radiation is applied to the photodetection structure 20, photocurrent is generated and detected, and the infrared radiation is detected. The photodetection structure 20 will be detailed later.

On the photodetection structure 20, the upper contact layer 13 of an about 300 nm-thickness n-GaAs layer of a $1\times10^{18}$ cm$^{-3}$ carrier concentration is formed. The photodetection structure 20 and the upper contact layer 13 are processed in a mesa.

On the lower contact layer 12, the lower electrode layer 14 of an about 100 nm-thickness AuGe/Au layer, and the upper electrode layer 15 of an about 100 nm-thickness AuGe/Au layer is formed on the upper contact layer 13.

A protection layer 16 of an about 200 nm-thickness SiON layer is formed except on the upper surface of the lower electrode layer 14 and the upper surface of the upper electrode layer 15.

Next, the photodetection structure 20 will be detailed with reference to FIG. 2.

In the photodetection structure 20, on the lower contact layer 12, the intermediate layer 21 of an about 45 nm-thickness i-Al$_{0.2}$Ga$_{0.8}$As layer is formed.

On the intermediate layer 21, a base layer 22 of an about 0.5 nm-thickness i-Al$_{1.0}$Ga$_{0.0}$As layer is formed.

On the base layer 22, the quantum dot layer 23 including a plurality of In$_x$Al$_y$As quantum dots is formed. The quantum dots are In$_x$Al$_y$As dots of a 25 nm-diameter and an about 5 nm-height and are formed in the plane of the quantum dot layer 23 in an about $5\times10^{10}$ cm$^{-2}$ density.

The In composition ratio x of the quantum dot In$_x$Al$_y$As and the Al composition ratio y thereof are, e.g., x32 0.6 and y=0.4.

The quantum dots may be InAs. In this case, to obtain long wavelength response, quantum dots which are smaller than the above are used in a higher density. For example, the size of the quantum dots is a 20 nm-diameter and an about 2 nm-height, and the density is about $1\times10^{11}$ cm$^{-2}$.

On the quantum dot layer 23, a cap layer 24 of an about 4.0 nm-thickness i-Al$_{0.4}$Ga$_{0.6}$As layer is formed, covering the plural quantum dots. In the case of using InAs quantum dots as the quantum dots layer 23, the thickness of a cap layer 24 may be about 2.0 nm.

On the cap layer 24, the intermediate layer 21 of an about 45 nm-thickness i-Al$_{0.2}$Ga$_{0.8}$As layer is again formed. Furthermore, in the same way, the base layer 22, the quantum dot layer 23, the cap layer 24 and the intermediate layer 21 are stacked in this order repeatedly 9 times. On the uppermost intermediate layer 21 of the photodetection structure 20 formed of the thus stacked layers, the upper contact layer 13 is formed.

Next, the energy band structure of the infrared photodetector according to the present embodiment will be explained with reference to FIG. 3.

The energy band structure of the infrared photodetector according to the present embodiment is characterized in that as illustrated in the energy band structure of FIG. 3, to improve the quantum confining effect by the quantum dot layer 23, the base layer 22 and the cap layer 24 to be the barrier layers to the energy are provided on both sides of a well of energy by the quantum dot layer 23.

The basic structure of the infrared photodetector according to the present embodiment as well as the proposed infrared photodetector is for forming wells of energy level at the bottom of the conduction band by alternately stacking the intermediate layer 21 whose band gap is large, and the quantum dot layer 23 whose band gap is narrow.

Furthermore, the base layer 22 whose band gap is large is provided between the intermediate layer 21 and the quantum dot layer 23 to thereby provide a barrier of energy on one side of a well of energy by the quantum dot layer 23, and the cap layer 24 whose band gap is large is provided between the quantum dot layer 23 and the intermediate layer 21 to thereby provide a barrier of energy on one side of a well of energy by the quantum dot layer 23.

The barrier layers are provided on both sides of a well of energy, whereby the effective depth of the well of energy by the quantum dot layer 23 can be increased, and the quantum confining effect of the concave potential is improved.

Such effect can be obtained by providing the barrier layer on one side of each well of energy, but on both sides of each well of energy, the barrier layers are provided to thereby improve such effect. In providing the barrier layers, the following points are taken into consideration to realize the energy structure suitable for the photodetection.

These barrier layers of energy are thin, and the electrons or holes are caused by the tunnel effect to tunnel the thin barrier layers and do not increase the energy necessary for the photoresponse. Response characteristics of a required long wavelength can be obtained.

Furthermore, in the infrared photodetector according to the present embodiment, as illustrated in the energy band view of FIG. 3, the height of the barrier layer to the wells of energy provided because of the quantum dot layer 23 on the side of the wells of energy on the side of the upper contact layer 13, i.e., the cap layer 24, is made relatively low, and the height of the barrier layer provided because of the quantum dot layer 23 on the side of the wells of energy on the side of the lower contact layer 12, i.e., the base layer 22, is made relatively high, whereby the quantum confining effect is made strong.

The base layer 22, the energy barrier height thereof is relatively high, is made thinner than the cap layer 24, whose energy barrier height is relatively low, which facilitates the tunneling of the excited electrons or holes, whereby response characteristics of a required long wavelength can be obtained without increasing energy required for the photoresponse.

However, to make the quantum confining effect preferentially more effective than the easy tunneling of the excited electrons or holes, the cap layer may be formed of $Al_{1.0}Ga_{0.0}As$ and have the same energy barrier height as the base layer.

In the infrared photodetector according to the present embodiment, the intermediate layer 21, the base layer 22 and the cap layer 24 are formed of the mixed crystal of AlGaAs, and the Al composition ratio is varied to thereby realize the energy band structure of FIG. 3. That is, the Al composition ratio of the intermediate layer 21 is made smaller than the Al composition ratio of the cap layer 24, and the Al composition ratio of the cap layer is made equal to or smaller than the Al composition ratio of the base layer 22.

Specifically, in the above-described embodiment, the intermediate layer 21 is formed of $Al_{0.2}Ga_{0.8}As$, the base layer 22 is formed of $Al_{1.0}Ga_{0.0}As$, and the cap layer 24 is formed of $Al_{0.7}Ga_{0.3}As$.

Of the mixed crystal composition of the AlGaAs of the base layer 22, the Al composition ratio can be smaller than 1.0 (but larger than the Al composition of the AlGaAs layer of the intermediate layer 21). However, to make the energy barrier at this part higher and furthermore to form InAs or InAlAs quantum dots on the AlGaAs base layer, the composition ratio of Al is preferably 1.0 because as the Al composition is larger, the dots can be formed in high densities. The high density quantum dot layer contributes to the increase of the infrared absorbance, which is effective to improve the performance of the infrared photodetector.

The above-described embodiment includes both the base layer 22 and the cap layer 24 of higher energy (high Al composition) than the intermediate layer 21. However, the effect of forming high density quantum dots is more important, the cap layer 24 can be omitted. In this case as well, the composition ratio of Al of the AlGaAs composition of the base layer 22 is made as large as, e.g., 1.0 to thereby maximize the energy barrier height, and the quantum confinement can be strengthened.

Next, the method for manufacturing the infrared photodetector according to the present embodiment will be explained with reference to FIGS. 4A to 6B.

Figure 4A:
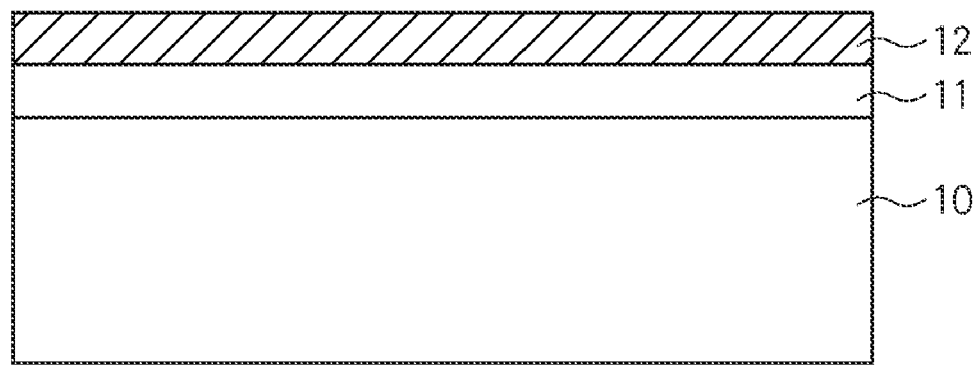
FIGS. 4A to 6B are sectional views of the infrared photodetector according to the embodiment in the steps of the method according to the embodiment for manufacturing the infrared photodetector, which illustrate the method.

First, on a GaAs substrate 10 whose upper surface is (001), the buffer layer 11 of a GaAs layer of, e.g., a 100 nm-thickness and the lower contact layer 12 of an n-GaAs layer of an about 500 nm-thickness and a $1\times10^{18}$ cm$^{-3}$ carrier concentration are sequentially grown by MBE (Molecular Beam Epitaxy) (FIG. 4A).

Figure 4B:
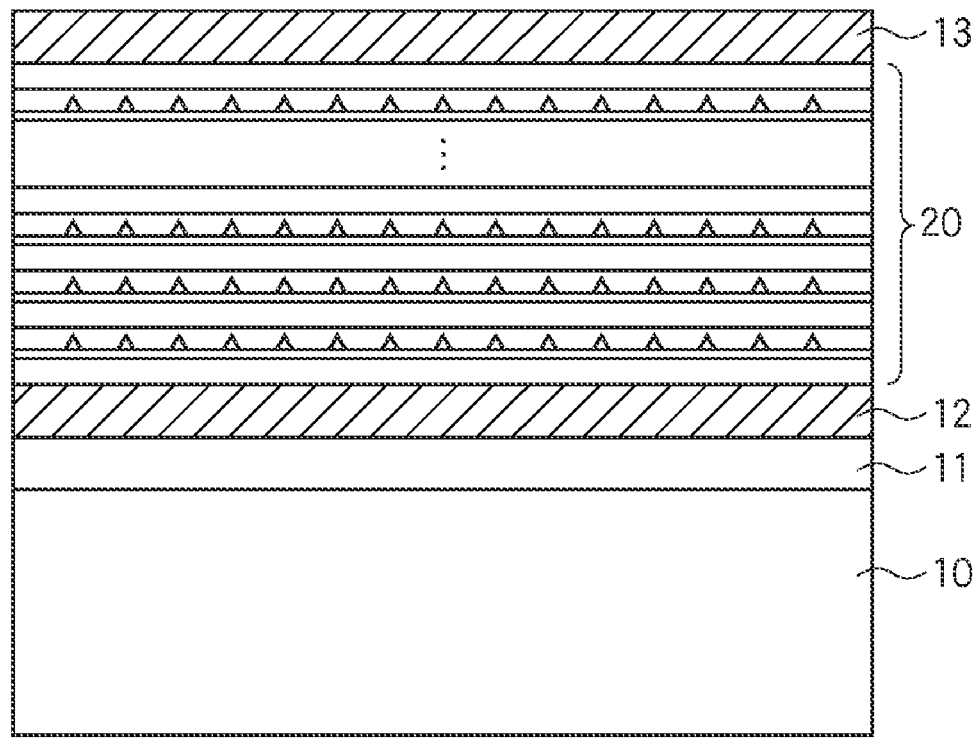

Subsequently, by MBE, on the lower contact layer 12, the intermediate layer 21 of an about 45 nm-thickness i-$Al_{0.2}Ga_{0.8}As$ layer and the base layer 22 of an about 0.5 nm-thickness i-$Al_{1.0}Ga_{0.0}As$ layer are sequentially grown (FIG. 4B).

Subsequently, by MBE, on the base layer 22, a plurality of quantum dots of $In_xAl_yAs$ are grown to form the quantum dot layer 23. The quantum dots are $In_xAl_yAs$ dots of a 25 nm-diameter and an about 5 nm-height and are formed in plane in an about $5\times10^{10}$ cm$^{-2}$ density (FIG. 4B).

Subsequently, by MBE, on the quantum dot layer 23, the cap layer 24 of an about 4.0 nm-thickness i-$Al_{0.4}Ga_{0.6}As$ layer is grown, covering the plural quantum dots (FIG. 4B).

Subsequently, by MBE, on the cap layer 24, the intermediate layer 21 of an about 45 nm-thickness i-$Al_{0.2}Ga_{0.8}As$ layer is grown. Hereafter, in the same way, on the intermediate layer 21, the base layer 22, the quantum dot layer 23, the cap layer 24 and the intermediate layer 21 are grown in this order sequentially 9 times, and the photodetection structure 20 is formed (FIG. 4B).

Subsequently, by MBE, on the uppermost intermediate layer 21 of the photodetection structure 20, the upper contact layer 13 of an n-GaAs layer of an about 300 nm-thickness and a $1\times10^{18}$ cm$^{-3}$ carrier concentration is grown (FIG. 4B).

Figure 5A:
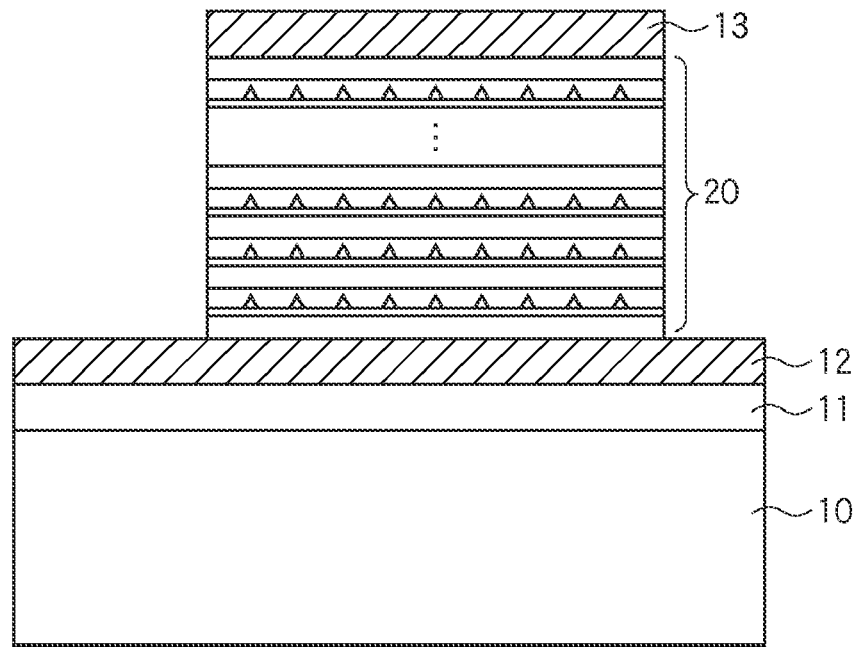

Next, by wet etching, the photodetection structure 20 and the upper contact layer 13 are etched into a mesa FIG. 5A).

Figure 5B:
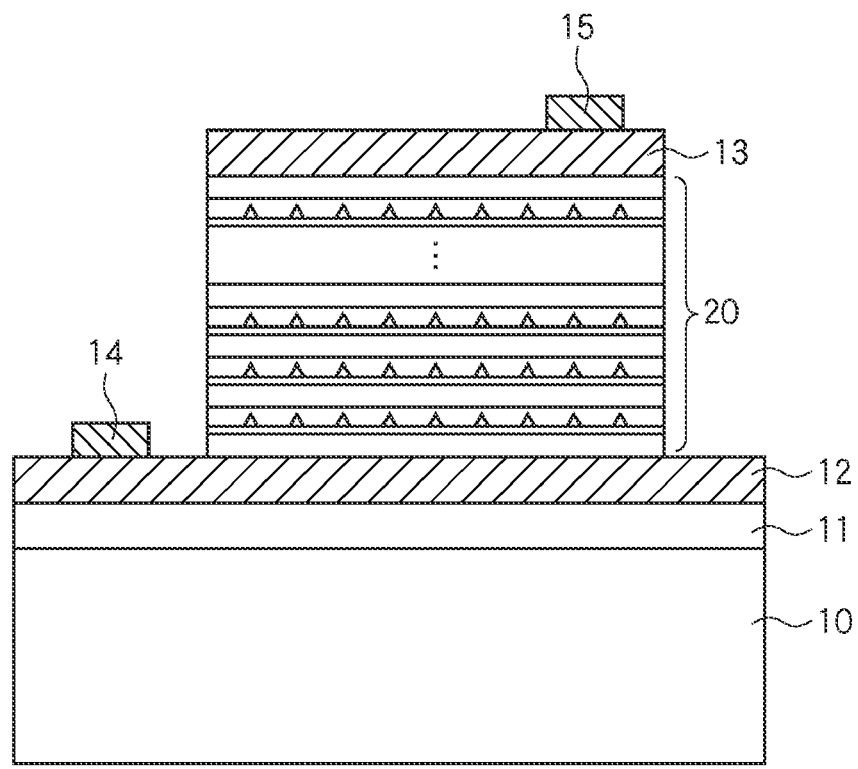

Next, a resist is applied to the entire surface to form a resist layer (not illustrated). Then, an electrode layer-to-be-formed region is opened in the resist layer. Then, on the entire surface, an about 100 nm-thickness AuGe/Au film (not illustrated) is deposited. Subsequently, the resist layer is removed, and by liftoff, on the lower contact layer 12 and the upper contact layer 13, the lower electrode layer 14 of an AuGe/Au layer and the upper electrode layer 15 of an AuGe/Au layer are formed (FIG. 5B).

Figure 6A:
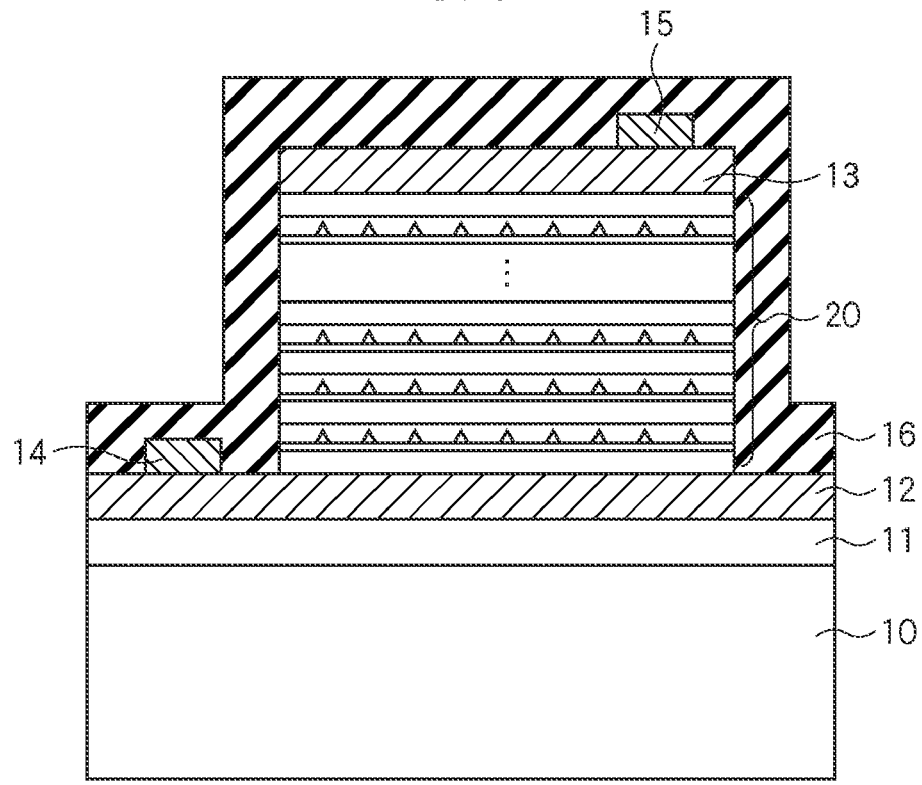

Next, by P-CVD (Plasma-enhanced Chemical Vapor Deposition Method), on the entire surface, the protection layer 16 of an about 200 nm-thickness SiON layer is formed (FIG. 6A).

Figure 6B:
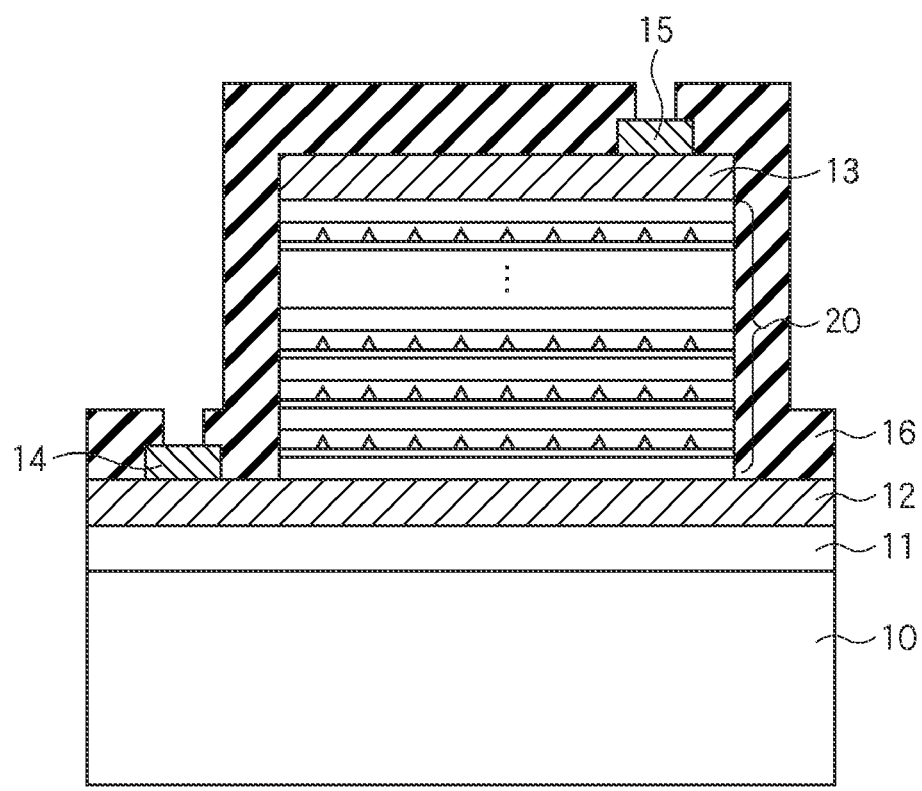

Next, by dry etching, in the protection film 16, contact holes are formed down to the lower electrode layer 14 and the upper electrode layer 15 (FIG. 6B).

As described above, according to the present embodiment, on one side of the quantum dot layer, the base layer is provided, the cap layer is provided on the other side, and the thin barrier layers are provided on both sides of the wells of energy, whereby the effective depth of the wells of energy provided by the quantum dot layer is increased to thereby improve the quantum confining effect without increasing energy required for the photoresponse.

In the manufacturing method described above, the quantum dots grown by MBE can be formed in InAs dots of the size of a 20 nm-diameter and an about 2 nm-height and in an about $1\times10^{11}$ cm$^{-2}$ density in plane of the quantum dot layer 23. It is possible that the cap layer is formed of $Al_{1.0}Ga_{0.0}As$, and the height of the barriers of energy on both sides of the quantum dot layer is maximized, whereby the quantum confining effect is improved.

Modified Embodiments

The present embodiment is not limited to the above-described embodiments and can cover other various modifications.

For example, the materials of the substrate, the upper contact layer, the lower contact layer, the intermediate layer, the base layer, the quantum dots and the cap layer are not essentially the materials described in the above-described embodiment.

For example, when a GaAs substrate is used, the material of the contact layer may be any one of GaAs, InGaAs, AlGaAs, GaAsN and InGaAsN.

When a GaAs substrate is used, the material of the intermediate layer may be any one of GaAs, AlGaAs, InGaP, and InGaAsN.

When a GaAs substrate is used, the material of the base layer may be any one of AlAs, AlGaAs, InAlAs, InAlP and GaAlP.

When a GaAs substrate is used, the material of the quantum dots may be any one of InAs, InGaAs, InAlAs, InAlSb and GaAsSb.

When a GaAs substrate is used, the material of the cap layer may be any one of AlAs, AlGaAs, InGaP, InGaAlP and InAlAs.

For example, when an InP substrate is used, the material of the contact layer may be any one of InP, InGaAs, InGaAlAs, InGaAsP and InAlAsP.

When an InP substrate is used, the material of the intermediate layer may be any one of InP, InAlAs, InGaAlAs, InGaAsP and InAlAsP.

When an InP substrate is used, the material of the base layer may be any one of AlAs, InAlAs, InGaAlAs, InGaAsP, InAlAsP and GaAlP.

When an InP substrate is sued, the material of the quantum dots may be any one of InAs, InGaAs, InAlAs, InAlSb and GaAsSb.

When an InP substrate is used, the material of the cpa layer may be any one of InGaAs, InAlGaAs, InGaAlP and InAlAsP.

For example, the conduction types of n-type and p-type described in the embodiment described above are not essential and may be opposite.

EXAMPLES

Examples will be explained.

Example 1

The infrared photodetector according to Example 1 is the infrared photodetector of the structure of FIGS. 1 and 2.

The photodetection structure 20 comprises an intermediate layer 21 of an about 45 nm-thickness i-$Al_{0.2}G_{0.8}As$ layer, a base layer 22 of an about 0.5 nm-thickness i-$Al_{1.0}Ga_{0.0}As$ layer, a quantum dot layer 23 including a plurality of InAs quantum dots and a cap layer 24 of an about 4.0 nm-thickness i-$Al_{0.7}Ga_{0.3}As$ layer stacked in this order repeatedly 10 times. The quantum dot is InAs dots of the size of a 25 nm-diameter and an about 5 nm-height and are formed in an about $1\times10^{11}$ cm$^{-2}$ density in the plane of the quantum dot layer 23.

Example 2

The infrared photodetector according to Example 2 is the infrared photodetector of the structure of FIGS. 1 and 2.

The photodetection structure 20 comprises an intermediate layer 21 of an about 45 nm-thickness i-$Al_{0.2}Ga_{0.8}As$ layer, a base layer 22 of an about 0.5 nm-thickness i-$Al_{1.0}Ga_{0.0}As$ layer, a quantum dot layer 23 including a plurality of InAs quantum dots, and a cap layer 24 of an about 4.0 nm-thickness i-AlAs layer stacked in this order repeatedly 10 times. The quantum dots are InAs dots of the size of a 25 nm-diameter and an about 5 nm-height and are formed in an about $1\times10^{11}$ cm$^{-2}$ density in the plane of the quantum dot layer 23.

Control

The infrared photodetector according to Control is the infrared photodetector of the structure of FIGS. 7 and 8.

The photodetection structure 120 comprises an intermediate layer 121 of an about 45 nm-thickness i-$Al_{0.2}Ga_{0.8}As$ layer, and a quantum dot layer 122 including a plurality of $In_{0.6}Al_{0.4}As$ quantum dots stacked in this order repeatedly 10 times. The quantum dots are $In_{0.6}Al_{0.4}As$ dots of the size of a 25 nm-diameter and an about 5 nm-height and are formed in an about $5\times10^{10}$ cm$^{-2}$ density in the plane of the quantum dot layer 122.

Characteristics of the Examples

Figure 10:
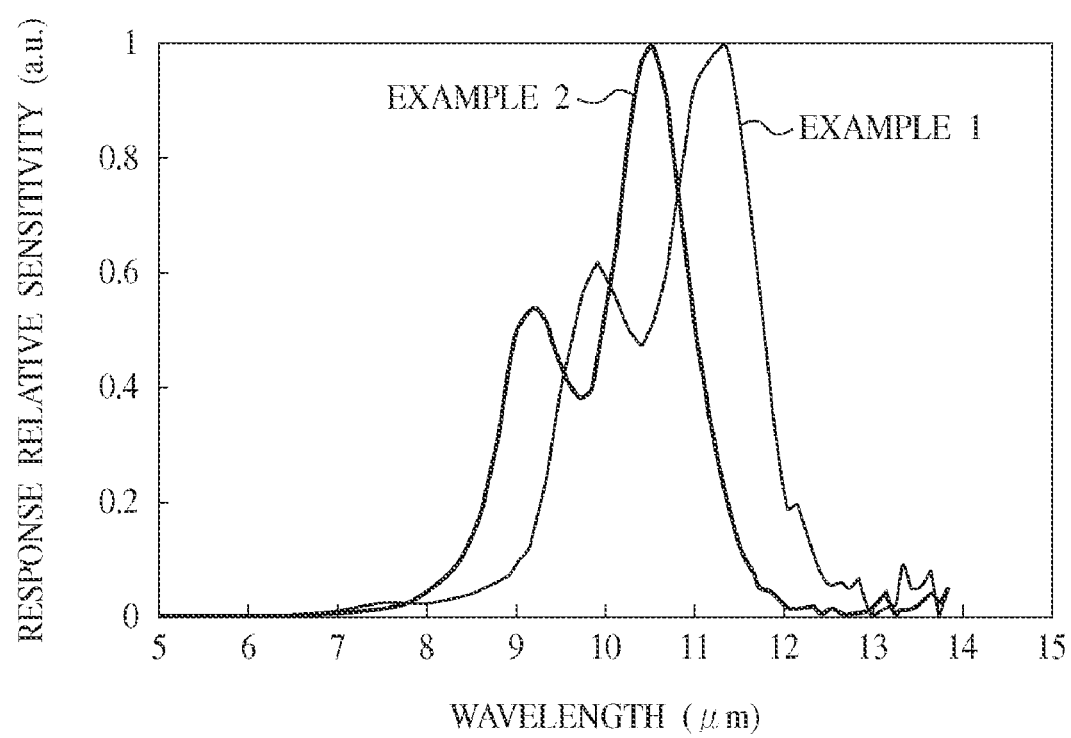
FIG. 10 is a view of the spectroresponse spectra of the infrared photodetector according to the examples.

FIG. 10 illustrates the spectroresponse spectra of the infrared photodetector according to the Examples. As illustrated in FIG. 10, both the infrared photodetector according to Example 1 and the infrared photodetector according to Example 2 have the characteristics that they respond in the long wavelength infrared range of 8-12 μm.

Figure 11:
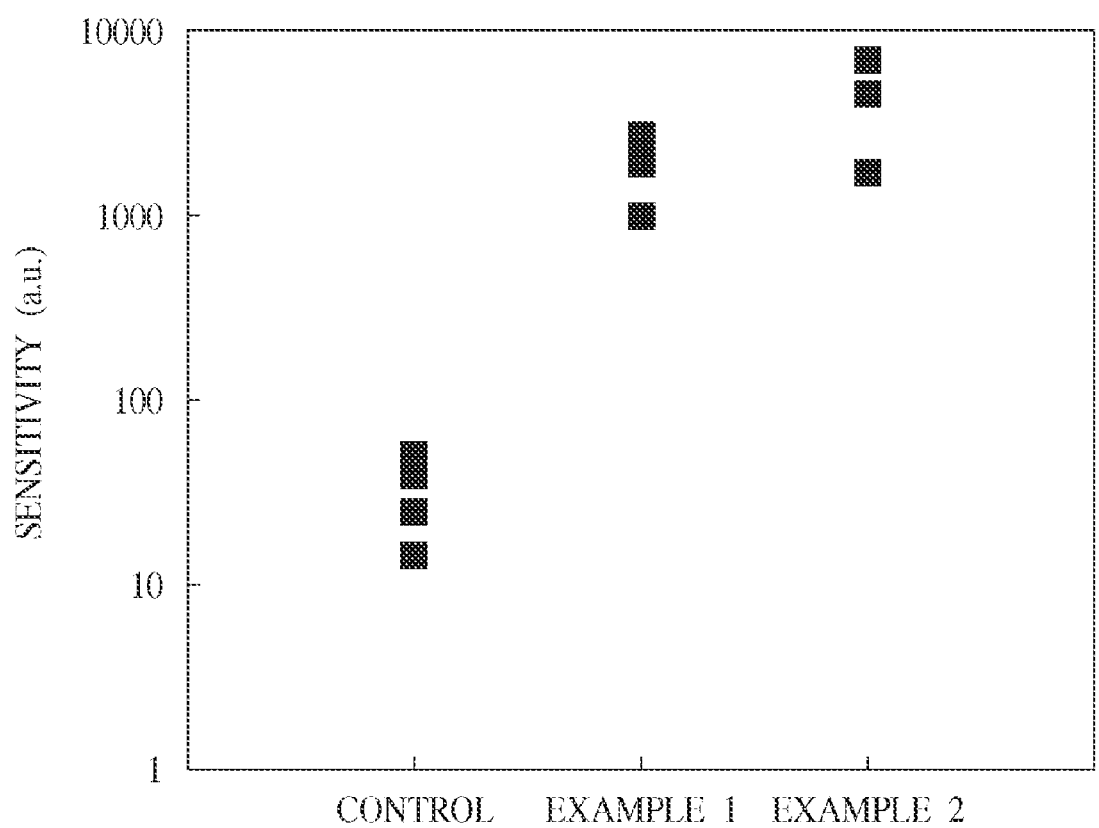
FIG. 11 is a graph of the sensitivity of the infrared potodetector according to the examples.

FIG. 11 illustrates the relative sensitivities of the infrared photodetectors according to the Examples. As illustrated in FIG. 11, both the infrared photodetector according to Example 1 and the infrared photodetector according to Example 2 have the sensitivity much improved in comparison with the infrared photodetector according to the Control. As the character of the sensitivity, a value given by dividing a photocurrent response intensity by a dark current which is a noise component was used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An infrared photodetector comprising a layer structure of an intermediate layer, and a quantum dot layer having a narrower band gap than the intermediate layer and including a plurality of quantum dots alternately stacked, and detecting photocurrent generated when infrared radiation is applied to the layer structure to thereby detect the infrared radiation, the infrared photodetector further comprising:
    a first barrier layer provided on one side of the quantum dot layer and having a larger band gap than the intermediate layer; and
    a second barrier layer provided on the other side of the quantum dot layer and having a larger band gap than the intermediate layer, wherein the first barrier layer is provided in contact with bottom surfaces of the quantum dots of the quantum dot layer,
the second barrier layer covers the quantum dots,
a thickness of the first barrier layer is smaller than a thickness of the second barrier layer, and
a band gap of the first barrier layer is equal to or larger than a band gap of the second barrier layer.

2. The infrared photodetector according to claim 1, wherein
the thickness of the first barrier layer is 0.5 nm or below, and
the thickness of the second barrier layer is 5 nm or below.

3. An infrared photodetector according to claim 1, wherein
the intermediate layer is formed of one compound selected out of a group of InP, InGaAs, InGaAlAs, InGaAsP and InAlAsP,
the first barrier layer is formed of one compound selected out of a group of AlAs, InAlAs, InGaAlAs, InGaAsP, InAlAsP and GaAlP,
the quantum dots are formed of one compound selected out of a group of InAs, InGaAs, InAlAs, InAlSb and GaAsSb, and
the second barrier layer is formed of one compound selected out of a group of InGaAs, InAlAs, InGaAlAs, InGaAsP, InAlAsP and GaAlP.

4. An infrared photodetector according to claim 1, wherein the intermediate layer, the first barrier layer, the quantum dots and the second barrier layer are formed of one compound or a mixed crystal of plural compounds selected out of a group of InAs, GaAs, AlAs, InP, GaP, AlP, InSb, GaSb, AlSb, InN, GaN and AlN.

5. The infrared photodetector according to claim 1, wherein
the intermediate layer is formed of one compound selected out of a group of GaAs, AlGaAs, InGaP and InGaAsN,
the first barrier layer is formed of one compound selected out of a group of AlAs, AlGaAs, InAlAs, InAlP and GaAlP,
the quantum dots are formed of one compound selected out of a group of InAs, InGaAs, InAlAs, InAlSb and GaAsSb, and
the second barrier layer is formed of one compound selected out of a group of AlAs, AlGaAs, InGaP, InGaAlP and InAlAs.

6. The infrared photodetector according to claim 5, wherein
the intermediate layer and the first barrier layer are formed of AlGaAs, and
an Al composition ratio of the intermediate layer is smaller than an Al composition ratio of the first barrier layer.

7. The infrared photodetector according to claim 6, wherein
the intermediate layer, the first barrier layer and the second barrier layer are formed of AlGaAs,
the Al composition ratio of the intermediate layer is smaller than the Al composition ratio of the second barrier layer, and
the Al composition ratio of the second barrier layer is equal to or smaller than the Al composition ratio of the first barrier layer.

8. The infrared photodetector according to claim 5, wherein
the first barrier layer is formed of AlAs, and
the quantum dots are formed of InAs or InAlAs.

9. The infrared photodetector according to claim 5, wherein
the first barrier layer and the second barrier layer are formed of AlAs, and
the quantum dots are formed of InAs or InAlAs.

10. The infrared photodetector according to claim 8, wherein the density of the quantum dots is $5 \times 10^{10}$ cm$^{-2}$ or above.

* * * * *